United States Patent [19]
Liu et al.

[11] Patent Number: 6,043,654
[45] Date of Patent: Mar. 28, 2000

[54] MULTI-VOLUME SLICING AND INTERLEAVED PHASE-ENCODING ACQUISITION FOR 3 D FAST SPIN ECHO (FSE)

[75] Inventors: Kecheng Liu; Yansun Xu, both of Solon; Mark J. Loncar, Richmond Heights, all of Ohio

[73] Assignee: Picker International, Inc., Highland Heights, Ohio

[21] Appl. No.: 08/970,192

[22] Filed: Nov. 14, 1997

[51] Int. Cl.[7] ..................................................... G01V 3/00
[52] U.S. Cl. ............................................ 324/309; 324/306
[58] Field of Search ..................... 324/300, 306, 324/307, 309, 314

[56] References Cited

U.S. PATENT DOCUMENTS

| | | | |
|---|---|---|---|
| 4,665,367 | 5/1987 | Kramer et al. | 324/309 |
| 5,167,232 | 12/1992 | Parker et al. | 324/309 |
| 5,270,654 | 12/1993 | Feinberg et al. | 324/309 |
| 5,631,560 | 5/1997 | Machida | 324/306 |
| 5,881,728 | 3/1999 | Mistretta et al. | 324/307 |

OTHER PUBLICATIONS

Overlapping Section Coverage in Multisection Imaging, Jürgen Hennig, PhD Radiologische Klinik, Kernspintomographie, Hugstetter–strasse.

Spatial Encoding and Reconstruction in MRI with Quadratic Phase Profiles, James G. Pipe Department of Radiology, Wayne State University, Detroit, Michigan.

Sliding Interleaved Ky 3D Acquisition: A Novel 3D MRA Technique with Suppressed Slab Boundary Artifact, Kecheng Liu, PhD and Brian K. Rutt, PhD 5th ISMRM p. 1840, 1997, Vancouver, Canada.

Systematic Assessment of Sliding Interleaved ky 3D Acquisition (SLINKY) Kecheng Liu, PhD and Brian K. Rutt, PhD 5th ISMRM, p. 1841, Apr., 1997, Vancouver, Canada.

Sliding Interleaved ky (SLINKY) 3D Acquisition in Clinical Diagnosis: Intracranial Vessels and Left Internal Carotid Aneurysm, Kecheng Liu, PhD, Donald H. Lee, MD and Brian K. Rutt, PhD p. 558, 5th ISMRM, 1997, Vancouver, Canada.

*Primary Examiner*—Louis Arana
*Attorney, Agent, or Firm*—Fay, Sharpe, Fagan, Minnich & McKee, LLP

[57] ABSTRACT

Resonance is excited in a first slab (12) and manipulated to generate a plurality of data lines (16, 18) which span a fraction of k-space, e.g. a quarter of the phase encoding steps along a y-direction. Resonance is then excited in a second slab (22) displaced from the first slab and another series of data lines are generated. A resonance is excited and data lines generated in a plurality of additional slabs (32, 42). A resonance is excited in a slab (52) which partially overlaps the slab (12), e.g., has three of four slices in common. A series of data lines in the slab (52) are phase encoded with a different fraction of k-space. Two sets of differently phase encoded data sets have been generated in the example of FIGS. 2a and 2b. This process is cyclically repeated exciting in slabs which partially overlap proceedingly generated slabs, each time generating a different fraction of the data lines until a completed set of data is generated in an extended volume larger than one slab, slices 4–16 in the example of FIGS. 2a and 2b.

13 Claims, 9 Drawing Sheets

MULTI-VOLUME SLICING AND INTERLEAVED PHASE-ENCODING ACQUISITION FOR 3 D FAST SPIN ECHO (FSE)

BACKGROUND OF THE INVENTION

The present invention relates to the art of magnetic resonance imaging. It finds particular application in conjunction with shifted interleaved multi-volume acquisition for 3D fast spin echo (SIMUVA) and will be described with particular reference thereto.

The Fast Spin Echo (FSE) imaging technique is a state-of-art technique, widely used in magnetic resonance imaging (MRI) applications. The technique provides a good tradeoff between shorter imaging time and distinct soft tissue contrast. Based on its successful application in 2D acquisition mode, 3D FSE was developed in order to cover a larger volume within a given longer repetition time, to improve signal-to-noise (SNR) and spatial resolution in the slice direction. For larger volumes and some applications, a series of 3D slabs are combined to form the volume image.

However, the 3D FSE technique suffers a problem of discontinuous boundaries (i.e., non-uniform signal intensity modulation) or venetian blind artifacts across the volume coverage, particularly the slab boundaries. Venetian blind artifacts involve signal intensity oscillations along the z-direction which degrades image quality and leads to falsified morphology and tissue contrast. The main causes of venetian blind artifacts in 3D FSE are i) imperfect RF pulses which result in amplitude fall-off and aliasing along the z axis at the edge of each volume, ii) inconsistent repetition time leading to non-uniform steady-state of spins in the overlapped regions, and iii) physical fluid motion in vivo.

Unlike the case in 3D Magnetic Resonance Angiography (MRA) in which only one RF pulse is applied to excite spins, the problem caused by imperfect RF pulse profiles is more complicated in 3D FSE because different echoes experience different RF trains. This means the imperfection of RF pulses (amplitude and phase behavior) might be accumulated with the echo train length (ETL) which makes it difficult to model such imperfections from echo to echo. That is, it becomes difficult to compensate for such effects.

The conventional solution that addresses this problem is to use slab overlap and average or blank the overlapping portion. See for example U.S. Pat. No. 5,167,232 of Parker et al. Analogous to that in 3D multiple slab/volume MRA, this strategy is straightforward, passive, and easy to implement. However, the slab overlap technique mitigates venetian blind artifacts only if the artifacts are caused by the imperfection of RF pulses alone.

Slab (volume) overlapping means an oversampling along z-axis is performed (typically defined by sampling ratio). The oversampled slices will be discarded or blanked due to phase aliasing and amplitude fall-off. Unfortunately, the oversampling strategy introduces slab overlapping regions in which the steady-state of spins is different with that of non-overlapping volumes, and is very hard to remove. The steady state of spins in the overlapped regions is dependent on slab overlap, the total number of volumes (even or odd), and the acquisition order (the particular interleaved acquisition technique for multi-volume 3D FSE).

When oversampling is applied, there are overlapped sub-volumes across two adjacent volumes experiencing non-uniform steady-state which contribute to the venetian blind artifacts. Unlike 3D MRA in which at 50% oversampling venetian blind artifacts can be removed; in 3D FSE the more oversampling, the more severe the venetian blind artifacts. Also, the shorter the repetition time, the more severe the venetian blind artifacts. Thus, using a slab or volume overlap strategy is contradictory in the sense that it mitigates the problem caused by imperfect RF pulses, but it exaggerates the non-uniform steady-state effect across the volume coverage. That is, more overlapping slices mitigates the imperfection of RF pulses but enlarges the non-uniform steady-state region, consequently expanding the dark bands of venetian blind artifact. In addition, slab overlap suffers from a time penalty thereby slowing down the scanning. This means longer imaging time is needed to cover the same volume. For these reasons, a larger slab overlap (oversampling) technique is a nonrobust and time-consuming solution.

Accordingly, it has been considered desirable to develop a new and improved shifted interleaved multi-volume acquisition (SIMUVA) technique which meets the above-stated needs and overcomes the foregoing difficulties and others while providing better and more advantageous results.

SUMMARY OF THE INVENTION

In accordance with one aspect of the present invention, a method of magnetic imaging is disclosed. The method includes applying a first resonance excitation pulse to excite magnetic resonance in a first slab, manipulating the excited magnetic resonance to generate a series of echos which are phase encoded in accordance with a first fraction of phase encoding steps in k-space, exciting magnetic resonance in a second slab displaced from the first slab, manipulating the excited magnetic resonance in the second slab to generate a series of data lines which are phase encoded with a second fraction of phase encode gradient steps of a complete data set, exciting magnetic resonance in a third slab which partially overlaps the first slab, manipulating the excited magnetic resonance in the third slab to generate a series of data lines which are phase encoded with a third fraction of the data lines of a complete data set, the third fraction being different from the first fraction, inducing magnetic resonance in a fourth slab which is only partially overlapping the second slab, manipulating the magnetic resonance induced in the fourth slab to generate a plurality of data lines which correspond to a fourth fraction of a complete data set, the fourth fraction being different from the second fraction, and combining the data lines and reconstructing the combined data lines into an image representation.

In accordance with another aspect of the present invention, a magnetic resonance imaging apparatus is disclosed. The apparatus includes mechanism for generating a magnetic field in an examination region. A radio frequency pulse controller and transmitter induces dipoles in the examination region to resonance such that radio frequency resonance signals are generated. Gradient magnetic field coils and a gradient magnetic field controller generate at least phase and read magnetic field gradient pulses in orthogonal directions across the examination region. A receiver receives and demodulates the radio frequency magnetic resonance signals, and an image processor reconstructs image representations. The image processor includes a mechanism for applying a first resonance excitation pulse to excite magnetic resonance in a first slab, a mechanism for manipulating the excited magnetic resonance to generate a series of echos which are phase encoded in accordance with a first fraction of phase encoding steps in k-space, a mechanism for exciting magnetic resonance in a second slab displaced from the first slab, a mechanism for manipulating the excited magnetic resonance in the second slab to generate a series of data lines which are phase encoded with a second fraction of phase encode gradient steps of a complete data set, a mechanism for exciting magnetic resonance in a third slab which partially overlaps the first slab, a mechanism for manipulating the excited magnetic resonance in the third slab to generate a series of data lines which are phase encoded with a third fraction of the data lines of a complete data set, the third fraction being different from the first fraction, a mechanism for inducing magnetic resonance in a fourth slab which is only partially overlapping the second slab, a mechanism for manipulating the magnetic resonance induced in the fourth slab to generate a plurality of data lines which correspond to a fourth fraction of a complete data set, the fourth fraction being different from the second fraction, and a mechanism for combining the data lines and reconstructing the combined data lines into an image representation.

One advantage of the present invention is the provision of a 3D FSE imaging technique which eliminates venetian blind artifacts in 3D FSE resulting in better quality images with consistent CNR and flow contrast (C-Spine imaging) along the z-direction.

Another advantage of the present invention is the provision of a 3D FSE imaging technique which maps signal intensity modulation along the z-direction in the image domain onto one phase encoding axis in k-space.

Yet another advantage of the present invention is the provision of a 3D FSE imaging technique which provides equalized signal modulation from slice to slice and less disturbances in the reconstructed images.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment(s) and are not to be construed as limiting the invention.

DETAILED DESCRIPTION OF THE PREFERRED EMBODIMENT(S)

Figure 1:
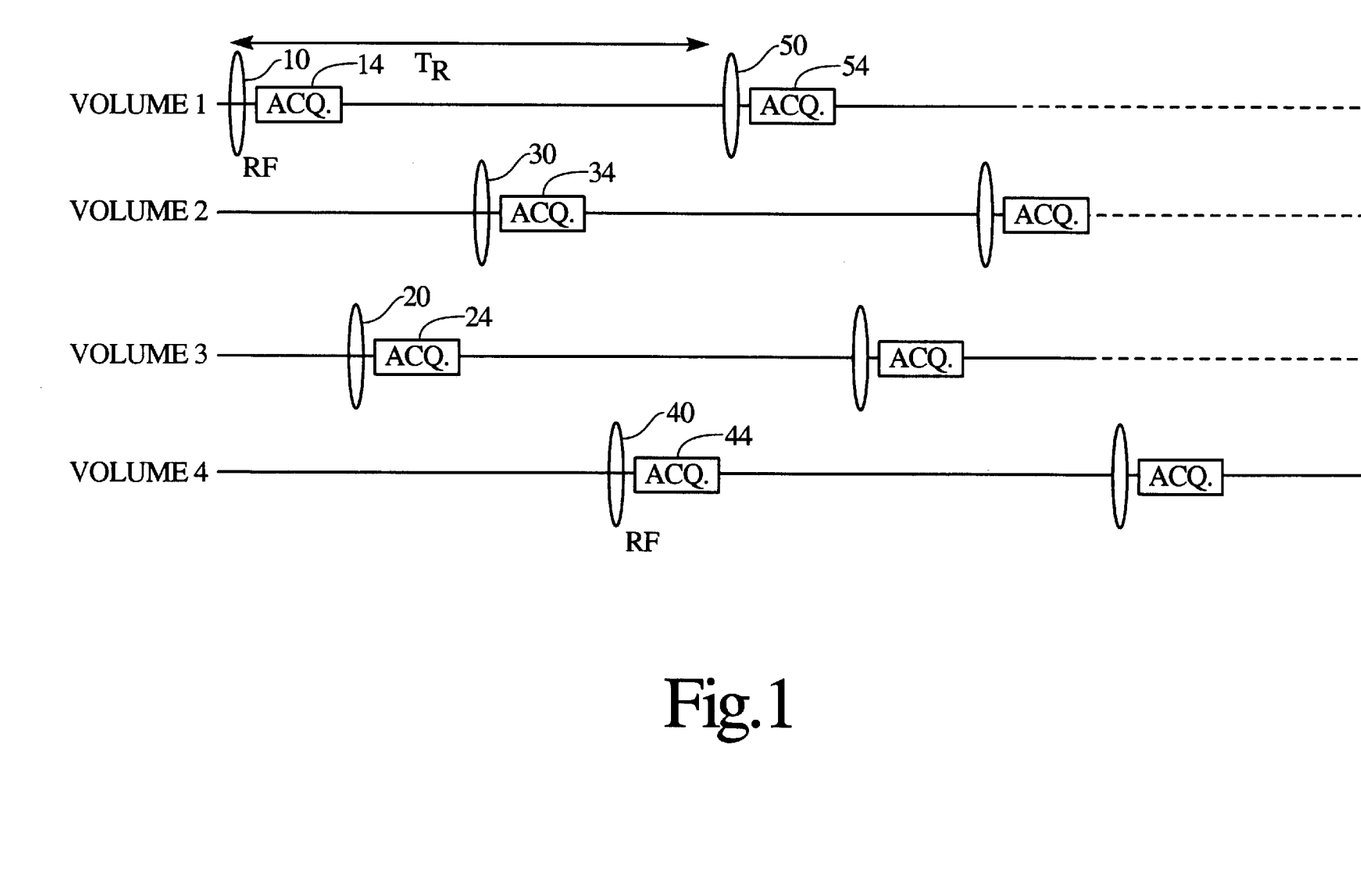
FIG. 1 is a diagrammatic illustration of a plurality of radio frequency pulses and subsequent multiple echo data acquisition sequences being applied to a plurality of slabs or volumes in accordance with the present invention.
Figure 2A:
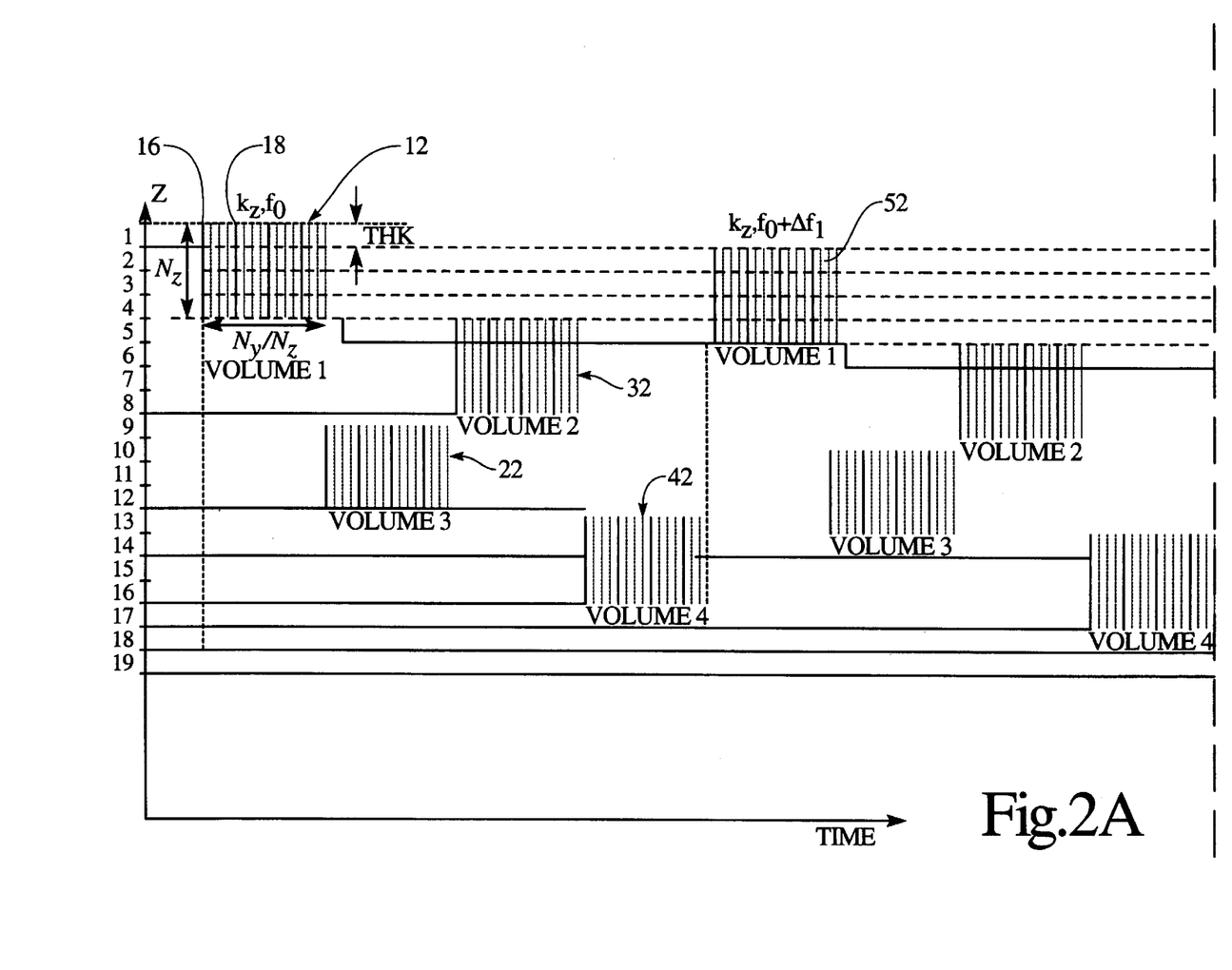
FIGS. 2a and 2b taken together are a diagrammatic illustration of the data lines generated as a result of the application of the radio frequency pulses and subsequent multiple echo data acquisition sequences to the slabs or volumes of FIG. 1.
Figure 2B:
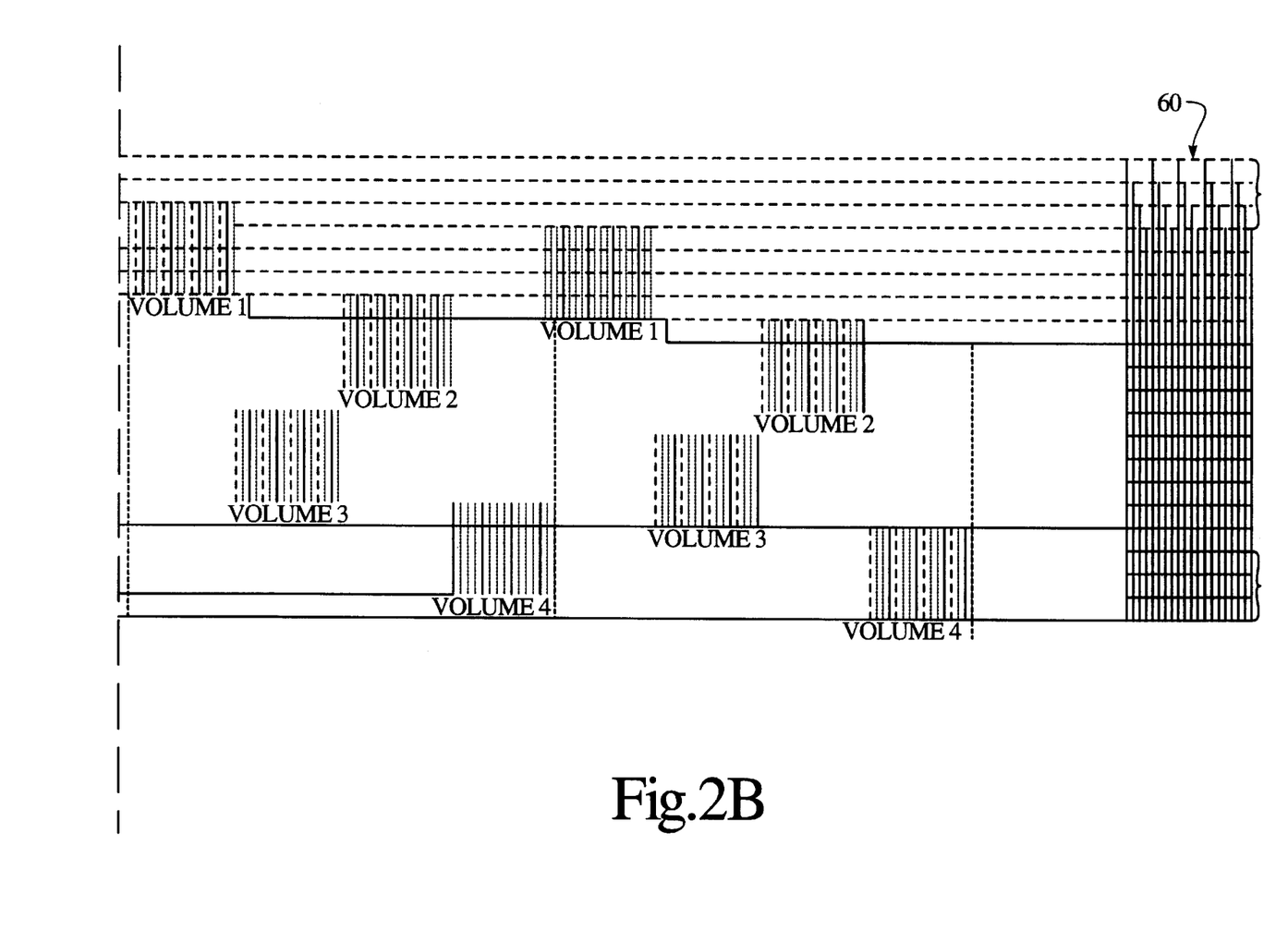

With reference to FIGS. 1, 2a, 2b, a radio frequency pulse 10 is applied concurrently with appropriate slab select pulses in the z-direction to limit excitation to a first slab 12 which is four units thick in the z-direction, i.e. within slices 1, 2, 3 and 4 of FIGS. 2a and 2b. Immediately following, a multiple echo data acquisition sequence 14 is applied. In the preferred embodiment, a fast spin echo technique is applied in which a radio frequency inversion pulse is applied to induce a first echo which is phase encoded to generate a first data line 16. Another radio frequency inversion pulse is applied along with a phase encoding pulse to generate a second data line 18 which is phase encoded with the fifth phase encode gradient step, in the illustrated embodiment. The inversion pulses and phase encode gradient pulses are applied to generate a data line at every fourth phase encode creating step, i.e. at phase encode gradient steps 1, 5, 9, etc.

At the end of the data acquisition sequence 12, a radio frequency pulse and slab select gradient pulse combination 20 is applied to excite resonance in a second slab 22 which spans slices 9, 10, 11 and 12 in the illustrated embodiment. Thus, the second excited slab is displaced by four steps in the z-direction from the first slab. A multi-echo data acquisition sequence 24 is then applied to acquire a plurality of data lines. Again in the illustrated embodiment, the data lines would be first, fifth, ninth, etc. phase encode steps are acquired. Similarly, a radio frequency excitation pulse and slice select gradient combination 30 are applied to excite resonance in a slab which spans slices 5–8, in the illustrated embodiment. A multi-echo data acquisition sequence 34 again generates echos with appropriate phase encodings to generate data lines phase encoded with the first, fifth, ninth, etc. phase encode steps.

Analogously, a fourth radio frequency excitation and slab select gradient pulse combination 40 are applied to excite resonance in a fourth slab 42 which spans slices 13, 14, 15 and 16. A multi-echo data acquisition sequence 44 has again applied generated data lines which are phase encoded with the first, fifth, ninth, etc. phase encode gradient steps. It is to be appreciated that this process can be continued through fifth or even a larger number of slabs. In fact, cycling through five slabs is advantageous in that by exciting resonance in slabs 1, 3, 5, 2, 4, etc., the time interval between exciting resonance in contiguous slabs is increased.

A radio frequency RF pulse and slab select gradient pulse combination 50 are then applied to excite resonance in a slab 52 which spans slices 2, 3, 4, and 5. It will be noted that slabs 12 and 52 are offset by one slice or z-direction increment. A multi-echo data acquisition sequence 54 is applied to again generate data lines which are phase encoded with every fourth phase encode gradient step. However, the phase encode steps which are encoded are the second, sixth, tenth, etc.

This process is repeated to generate magnetic resonance data lines in slabs which are offset by one z-increment or slice, which data lines are phase encoded with different phase encode gradient steps. In the illustrated embodiment in which four volumes are collected and every fourth data line is collected within each set, a total of 16 resonance excitation and multi echo data acquisition sequences are applied to generate a data set shown diagrammatically as 60 in FIGS. 2a and 2b. It will be seen that the data sets corresponding to the first, second, third, seventeenth, eighteenth and nineteenth slices or z-increments are incomplete. For example, the data set corresponding to the first slice has only one quarter of the data lines of a pulse data set; the data set corresponding to the second slice has half the data lines; the data set corresponding to the third slice has three quarters of the data lines. These data sets can be zero filled or interpolated, but it is preferred that the reconstructed image data corresponding to the six slices be discarded.

It will be seen that data lines which are phase encoded the first, fifth, ninth, etc. phase encode gradient steps will have a discontinuity in the z-direction between the fourth and fifth data line, between the eighth and nine z-increment or slice, between the twelfth and thirteen z-increment or slice and after the sixteenth z-increment or slice. That is, by stacking the like phase encoded data lines from the slabs 12, 32, 22, 42, and elongated data line is generated with potential discontinuities as described. However, the data lines generated at the second, sixth, tenth, etc. phase encode gradient steps will have discontinuities between the fifth and sixth z-increment or slice, the ninth and tenth z-increment or slice, the thirteen and fourteenth z-increment or slice. The data lines generated with the third, seventh, eleventh, etc. phase encode gradient steps will have their discontinuities between the sixth and seventh z-gradient increment or slice, between the ninth and tenth z-gradient increment slice and between the fourteenth and fifteenth z-gradient or slice. In this manner, the z-direction discontinuities are staggered. Because the discontinuities are staggered, uniformly, the effect of the discontinuities is averaged or blended and the venetian blind effect is inhibited.

Of course, it is to be appreciated that the use of four slabs with data lines at every fourth step generated in each repetition is by way of example only. The sequence may cycle between a larger or smaller number of slabs. Within each slab, data lines can be phase encoded with a different fraction of the phase encode gradient steps. Increasing the distance between phase encode gradient steps in each slab increases the length of the imaging sequence by requiring more repetitions but smooths and reduces the potential for venetian blind artifacts. On the other hand, collecting a larger percentage of the data lines in each slab shortens the time of the imaging sequence, but increases the effect of the discontinuities.

Figure 3:
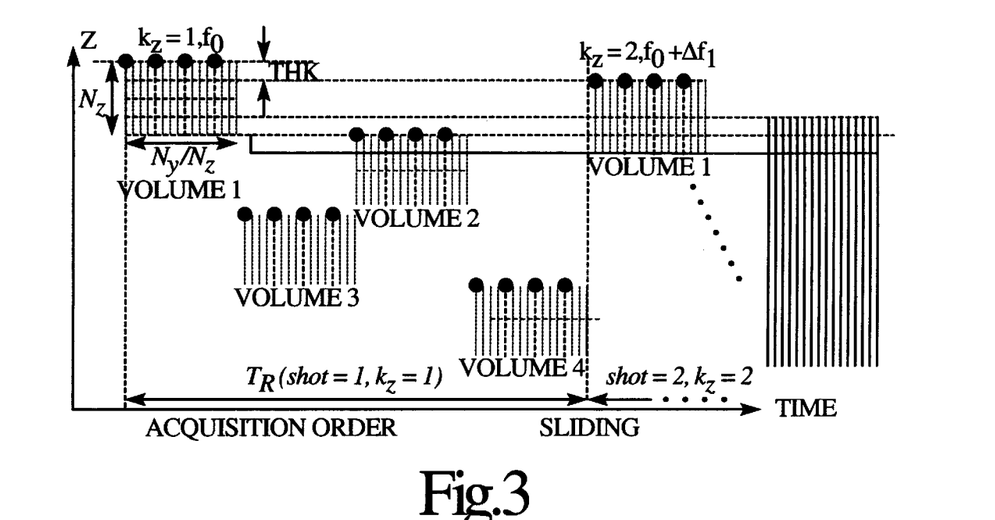
FIG. 3 is a diagrammatic illustration of a multi-volume slicing and interleaved $k_Y$ phase encoding acquisition with $k_Y$ priority acquisition where y-views (shots) are arranged in the most inner loop and the sliding interval is $T_R$.

In the embodiment of FIGS. 2a and 2b has been explained with reference to the z-and y-directions, i.e. data is frequency encoded in the z-direction and data lines are generated with a fraction with the phase encode gradient steps in the y-direction. Of course, data is also phase encoded in the z-direction. In the embodiment of FIGS. 2a and 2b, in each data acquisition, off data lines with all of the x-phase encode gradient steps are generated corresponding to each of the first, fourth, etc. y-encode gradient steps. It is to be appreciated, that one need not collect a fraction of the y-phase encode steps and all of the corresponding x-phase encode gradient steps. That is, in the 16×16×16 illustrated embodiment, a data line is generated with the first five phase encode gradient steps and each of the sixteen x-phase encode gradient steps, with the fourth y-phase encode gradient step and each of the sixteen x-encode gradient steps. It is to be appreciated that one may take a quarter of the data lines by intermixing the x- and y-phase encode gradient steps in other orders. For example, as illustrated in FIG. 3, data lines can be collected with the phase encoding step along the x-axis with as much phase encoding as time in sequence permits being collected along the y-axis.

In the illustrated example in which there are sixteen phase encode in each of the x- and y-direction, and every fourth phase encoding is sampled, it is preferred to collect sixteen data lines per acquisition depending on the subject matter examined and the total number of steps in case phase collecting a quarter of the data lines in each excitation may not be practical. In one embodiment, resonance is excited repeatedly in the same slab until the quarter of the data lines are collected. In another embodiment, a smaller fraction of the data lines are collected after excitation. In the subsequent excitation, resonance is excited in a different slab. After obtaining the smaller fraction of data lines from all of the slabs, the first slab is again excited to obtain an additional fraction of the data lines for each physical slab.

The shifted interleaved multi-volume acquisition for 3D fast spin echo (SIMUVA) technique of the present invention extends the SLINKY (z-$\underline{Sl}$iding $\underline{I}$nterleaved $k_Y$) 3D acquisition technique to a general 3D multiple slab or volume acquisition, such as 3D FSE, in order to suppress venetian blind artifacts (VBA) or slab boundary artifacts (SBA) caused by imperfect response of RF pulses, inconsistent repetition time or spin steady-state across the volume coverage, or physical fluid motion in vivo, e.g., CSF.

The SIMUVA acquisition technique transforms non-uniform slab profiles into periodic functions along the $k_Y$ phase encoding direction where the function changes very slowly from slice to slice. After performing a Fourier transform, periodic amplitude modulations lead to less signal intensity oscillations than the original slab profile.

The operation of the SIMUVA technique for 3D FSE is different from 3D MRA. In 3D MRA, a "thin slab" slices in the slice or z-direction continuously and periodically as many times as the desired volume is covered. In 3D FSE, multiple "thin-slabs" are slid only one period or designated times which is usually the number of shots, to accomplish the entire data acquisition.

In the SIMUVA technique, data acquisition order or $k_Z$–$k_Y$ trajectory is carefully designed so that non-uniform signal intensity modulation across the slab is evenly re-distributed along the $k_Y$ axis. According to the $k_Z$–$k_Y$ trajectory, there are two possible modes of operation: $k_Z$ priority acquisition and $k_Y$ priority acquisition.

In the $k_Z$ priority acquisition mode of FIGS. 2a and 2b, $k_Z$ encoding (z-views) is arranged in the most inner loop. For a fixed shot, all z-encodings will be collected before sliding to the next z position (i.e., performed before thin slabs "walk" to the next z position). The interval between slidings or shifts is $N_Z \times T_R$. After $N_Z$ shifts or slidings, which should be equal to the number of shots, the acquisition is accomplished. The loop structure/control should be therefore designed in the following way:

$$\Rightarrow N_{shot} = 0 \ldots m-1 \text{ with } m = N_z = N_{z\_total} - N_B$$

$$\Rightarrow f_{RF} = f_0 + N_{shot} \times \Delta f \text{ where } \Delta f = \gamma G_s \times THK$$

$$\Rightarrow \phi_{RF} = \phi_0 + N_{shot} \times \Delta \phi$$

$$\Rightarrow zview = 0 \ldots N_{z\_total} - 1$$

$$\Rightarrow \text{Data acquisition}$$

here m is the number of shots, $f_0$ the base frequency for RF pulse, $\phi_0$ the base phase of the RF pulse for excitation, and $N_Z$ the number of z-phase encoding steps.

In the $k_Y$ priority acquisition mode of FIG. 3, $k_Y$ coding (y-views) is arranged in the most inner loop. For a fixed z-encoding step, all y-encoding steps or shots are collected. Volume will be shifted by each shot. After m shots or shifts, volume is shifted back to its original position with $f_{RF} = f_0$ and z-view will be increased by one step. The interval between shifts or slidings in this mode becomes $T_R$. Volume sliding is performed periodically (cycle) in spatial position.

After $N_Z$ sliding cycles all phase encoding steps are collected and, the acquisition is accomplished.

The loop structure is therefore designed in the following way:

$$\Rightarrow zview = 0 \ldots N_{z\_total}$$

$$\Rightarrow f_{RF} = f_0$$

$$\Rightarrow \phi_{RF} = \phi_0$$

$$\Rightarrow N_{shot} = 0 \ldots m-1 \text{ with } m = N_z = N_{z\_total} - N_B$$

$$\Rightarrow f_{RF} = f_0 + N_{shot} \times \Delta f \text{ where } \Delta f = \gamma G_s \times THK$$

$$\Rightarrow \phi_{RF} = \phi_0 + N_{shot} \times \Delta \phi$$

$$\Rightarrow \text{Data acquisition}$$

where m is the number of shots, $f_0$ is the base (center) frequency for RF pulse, $\phi_0$ the base phase of the RF pulse for excitation, $N_Z$ the number of z-phase encoding steps. As an example, assuming $N_Z$, m=$N_Z$, thus the sliding by step of one slice thickness will occur at the time interval of $T_R$. One sliding cycle contains m=$N_Z$ shifting. After $N_{Z\_}$ sliding cycles all data is collected.

The major limitations and relevant problems of using shifted interleaved multi-volume acquisition for 3D fast spin echo (SIMUVA) technique are related to $k_Y$ phase encoding steps, $k_Y$ phase encoding arrangement ($k_Y$ map), biased phase error correction and ghosting artifact which cannot be masked by MIP processing.

With regard to the number of slidings ($N_S$), unlike conventional acquisition, using SIMUVA, a 3D matrix will be fully sampled until number of slidings are performed. The number of sliding is in the range of 1–$N_Z$ where $N_Z$ equals to $NZ_{total} - N_B$ of which $NZ_{total}$ is the total number of $k_Z$-encoding steps and $N_B$ is the number of blanked slices. For the case of $N_S=1$, it is then equivalent to a conventional 3D acquisition. While in the case of $N_S=N_Z$, the entire slab profile is transformed to a periodic function along the $k_Y$-axis and therefor the venetian blind artifact is maximally suppressed.

Correspondingly, if $N_S=N_Z/2$, only half partition of the slab profile is transformed into the $k_Y$-axis and consequently such kind of weighing function or amplitude modulation along the $k_Y$-axis is changing from slice to slice correspondingly. The venetian blind artifact is suppressed but not completely. It should be pointed out that the wasted slices are proportional to $N_S$, which exactly equals to $N_S-1$. Here the wasted slices means that they do not contribute to final volume coverage.

With regard to the number of $k_Y$ phase encoding steps ($N_Y$), in order to acquire evenly interleaved $k_Y$ acquisition fashion, $N_Y$ is chosen such that it is equal to:

$$N_Y = N_S \times N_G$$

where $N_G$ is the number of $k_Y$ lines per each group or per each sliding, and $N_S$ is the number of slidings. This equation indicates that the total number of $k_Y$ phase encoding steps should be completely divided by the number of slidings $N_S$.

In 3D FSE, $N_G$ is limited by ETL (Echo Train Length). That is, $N_G$ is an integer of ETL:

$$N_G = k \cdot ETL \text{ with } k=1,2K$$

In the typical case, $N_G$ is equal to ETL.

With regard to phase encoding order ($k_Y$ map), there are variety of phase encoding order arrangements, depending on desired $T_1$- or $T_2$-weighted images. The arrangements can be divided into two categories: uniformly segmented arrangement (band) and arbitrary arrangement. This can be characterized by a parameter $\Delta N_Y$ which describes the $\Delta k_Y$ of adjacent echoes, e.g. first echo and second echo.

Figure 4A:
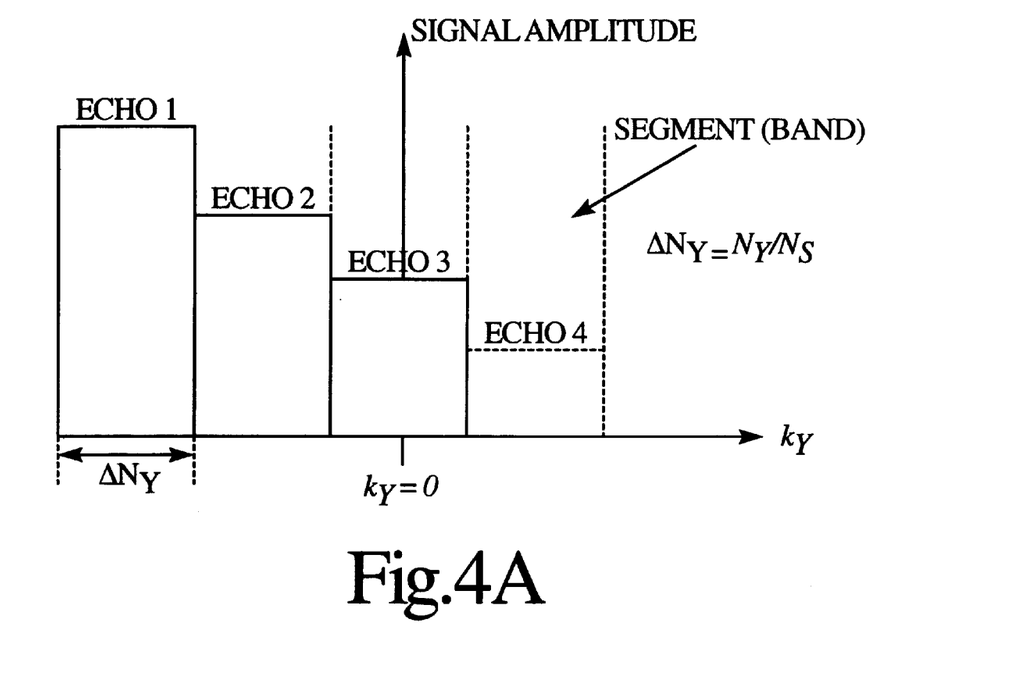
FIG. 4a is a diagrammatic illustration of a permissible phase encoding order (y-view map) where the first echo is arranged on the edge of k-space.
Figure 4B:
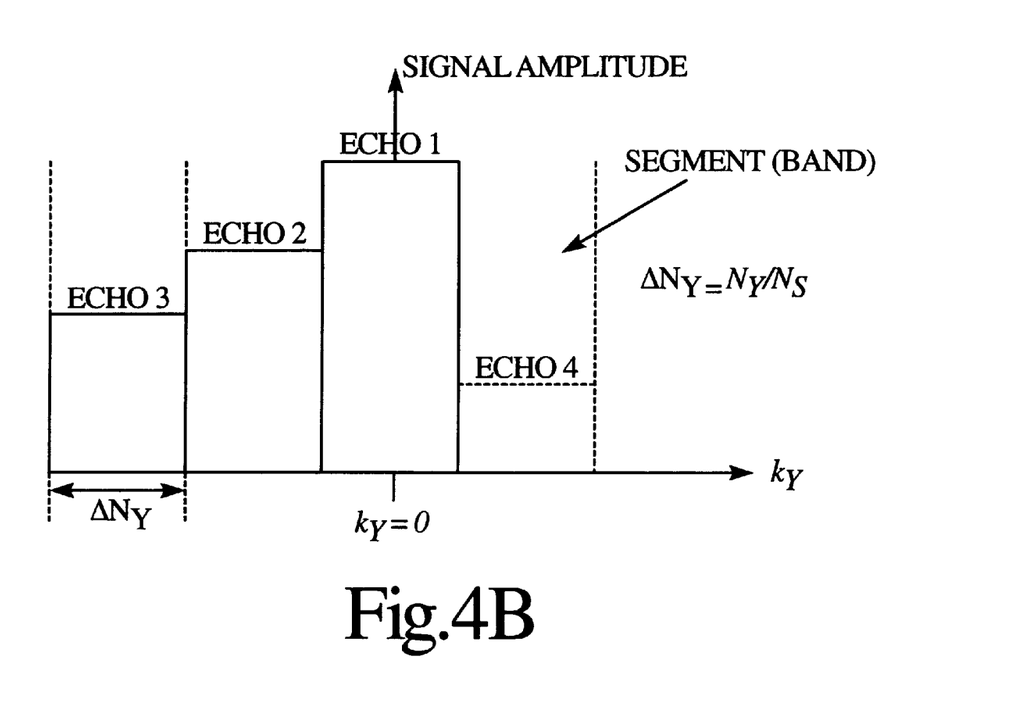
FIG. 4b is a diagrammatic illustration of a permissible phase encoding order (y-view map) where the first echo is arranged on the center of k-space.

FIGS. 4a and 4b show two cases of the segmented arrangement in which $\Delta N_Y$ fulfills the condition of evenly allocated $k_Y$-lines per each shot, no matter what order of the segments or bands in k-space are.

Figure 5A:
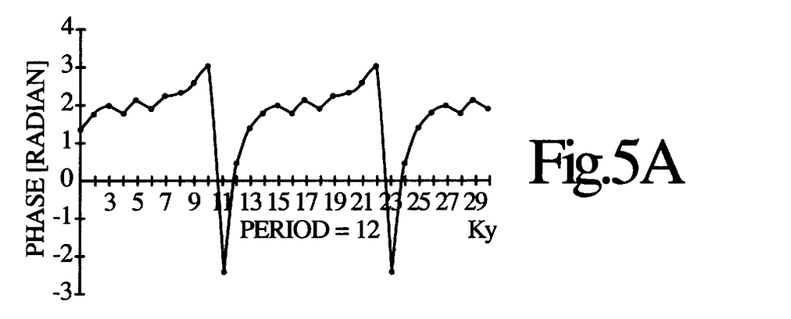
FIG. 5a is a graph illustrating correction of data inconsistencies by periodic phase modulation along the $k_Y$-axis.
Figure 5B:
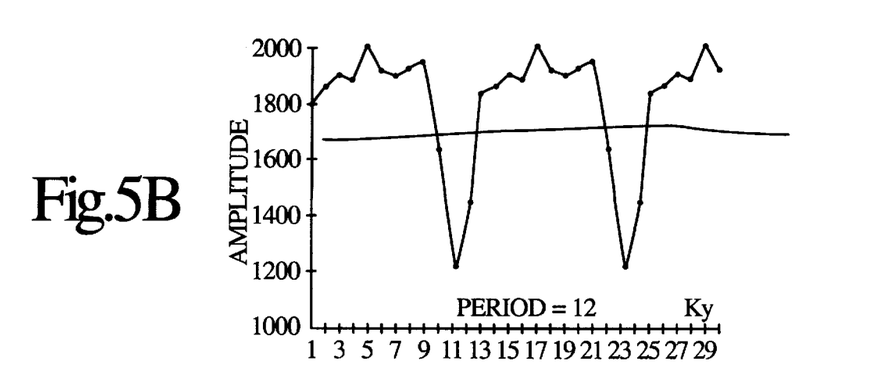
FIG. 5b is a graph illustrating correction of data inconsistencies by periodic amplitude modulation along the $k_Y$-axis.

One obstacle of using SIMUVA is the phase error introduced by the re-mapping the slab profile into the $k_Y$-axis. Since the slab profile could be understood as a complex function, the phase error across the slab is then converted into a periodic function along the $k_Y$ phase encoding direction too as the amplitude modulation. This phase error is absolutely removed prior to Y-FFT as shown in FIGS. 5a and 5b. In a FE (Field Echo) sequence, this kind of phase error is mainly caused by a single RF pulse (for excitation) and can be therefore simply corrected by using a lookup table (pre-calibration) or using navigator echoes.

In 3D FSE, this phase error is complex. Concerning only the RF pulses, at least RF pulse (excitation or refocus) might contribute to such phase changes. That is, this phase error might be echo position dependent. To understand the source of phase error and then to correct the conventional phase correction (remove biased phase error from echo to echo) in FSE must be modified to absolute correction if relative correction is used. To analyze this point, it is assumed that there are phase errors from echo to echo, and from slice to slice:

$$\phi_i^j = f(i, j, \text{system})$$

where subscript i is the index of echo number ranging from 1 ... ETL (Echo train length), and superscript j is the slice index across the slab in the range of (1 ... $N_Z$). If these phase errors are not removed prior to Y-FFT, severe ghosting will degrade the reconstructed images. To remove these phase errors, there are two possibilities: relative correction referring to the first echo signal, and absolute correction.

Figure 6A:
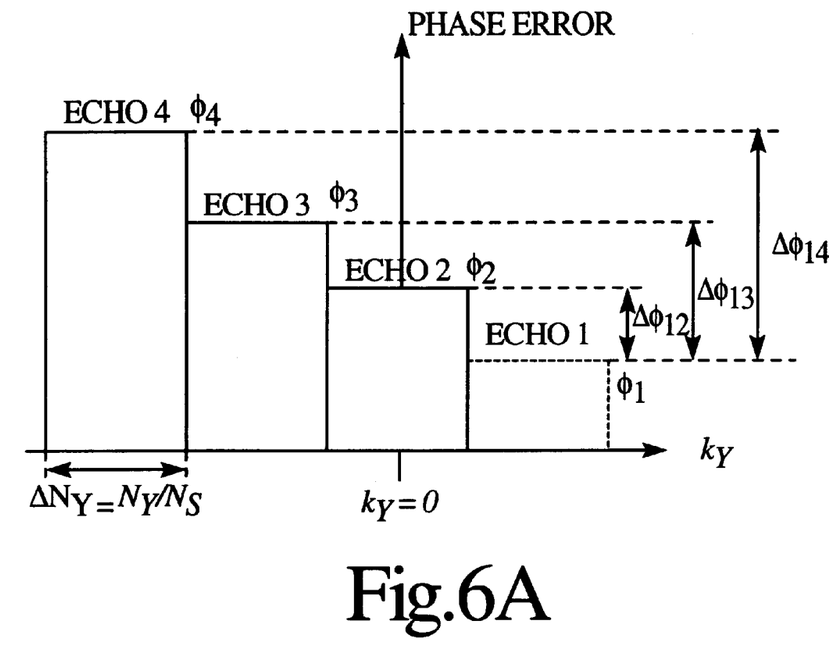
FIG. 6a is a diagrammatic illustration of a scheme for relative correction of phase error where the biased phase of first echo signal is used as reference for calculating a correction value.
Figure 6B:
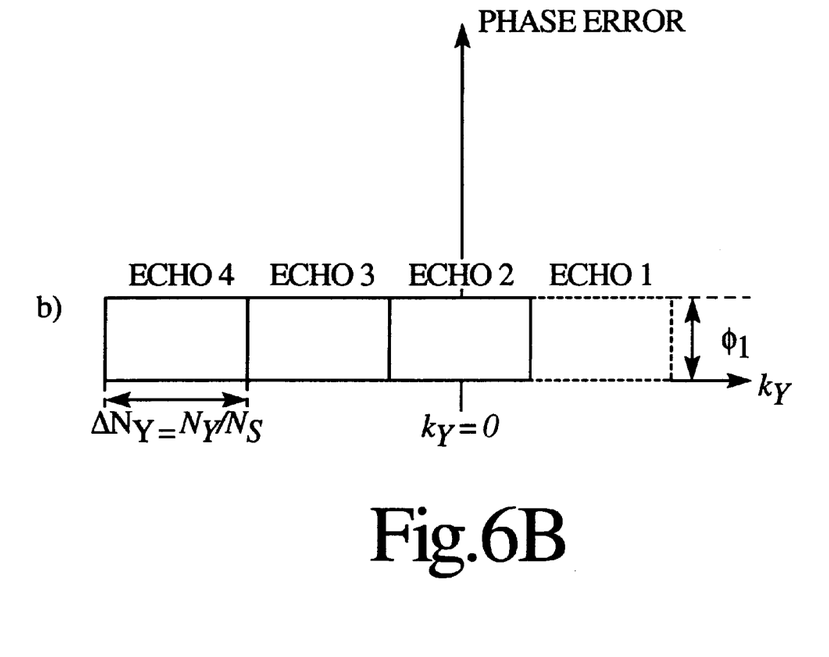
FIG. 6b is a diagrammatic illustration of a scheme for relative correction of phase error where the corrected phase error is still biased but uniform for whole slice.

With regard to relative correction referring to the first echo signal, the correction is applied based on the phase difference between the first echo and with echo:

$$\Delta \phi_{1,i}^j = \phi_1^j - \phi_i^j \text{ with } i=2,K,ETL$$

as illustrated in FIGS. 6a and 6b. Thus, after the correction the biased phase errors on each echo signal become:

$$\phi_i{}^j = \phi_2{}^j \Lambda = \phi_{ETL}{}^j = \epsilon(j)$$

It must be noted that after the correction, there is still phase discrepancies from slice to slice, i.e.

$$\epsilon(j) \neq \epsilon(j+1) \text{ with } j=1,K,N_z-1$$

This phase discrepancy does not cause any degrade of image quality in conventional 3D FSE but produces severe ghosting artifacts simply because the $k_Y$ data is assembled from different slice positions.

Figure 7A:
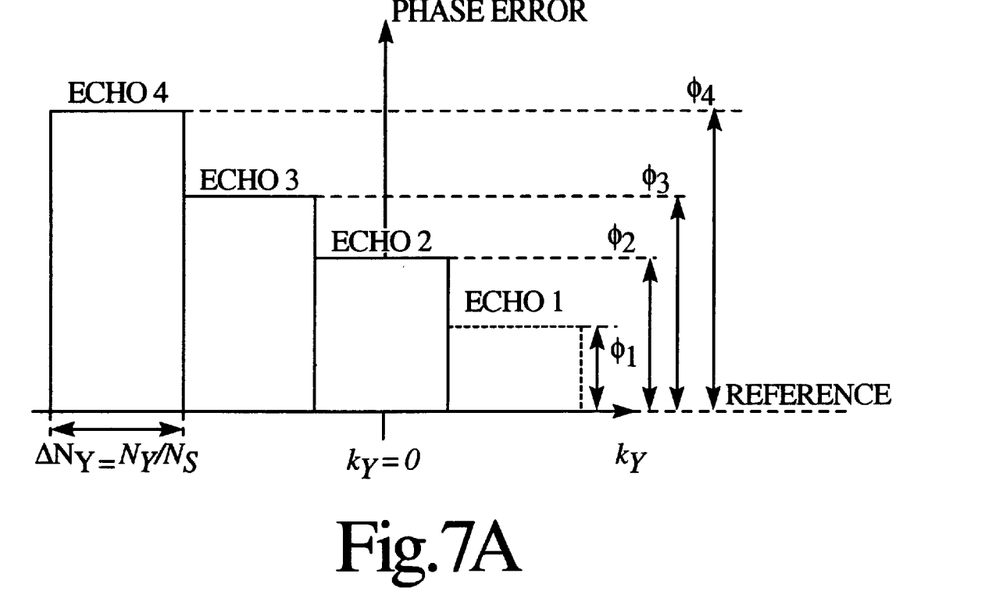
FIG. 7a is a diagrammatic illustration of a scheme for absolute correction of phase error where the zero phase is used as reference for calculating correction value.
Figure 7B:
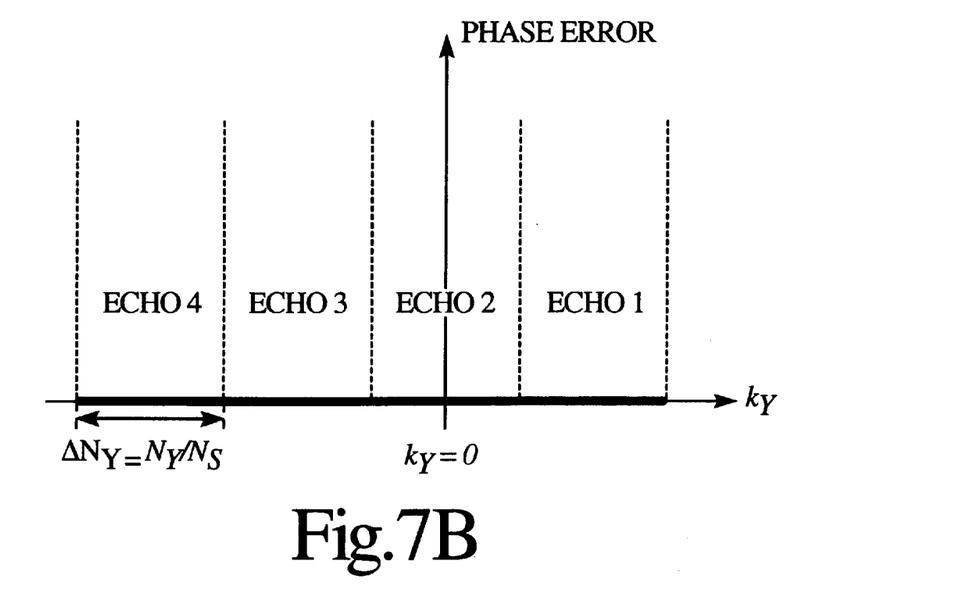
FIG. 7b is a diagrammatic illustration of a scheme for absolute correction of phase error showing the corrected phase errors, with no bias and identical from slice to slice.

With regard to absolute correction, the reference phase is chosen as zero. Thus, the correction is performed based on phase difference between zero phase and the biased phase of the ith echo:

$$\Delta \phi_i{}^j = 0 - \phi_i{}^j \text{ with } i=1,K,\text{ETL}$$

Figure 8:
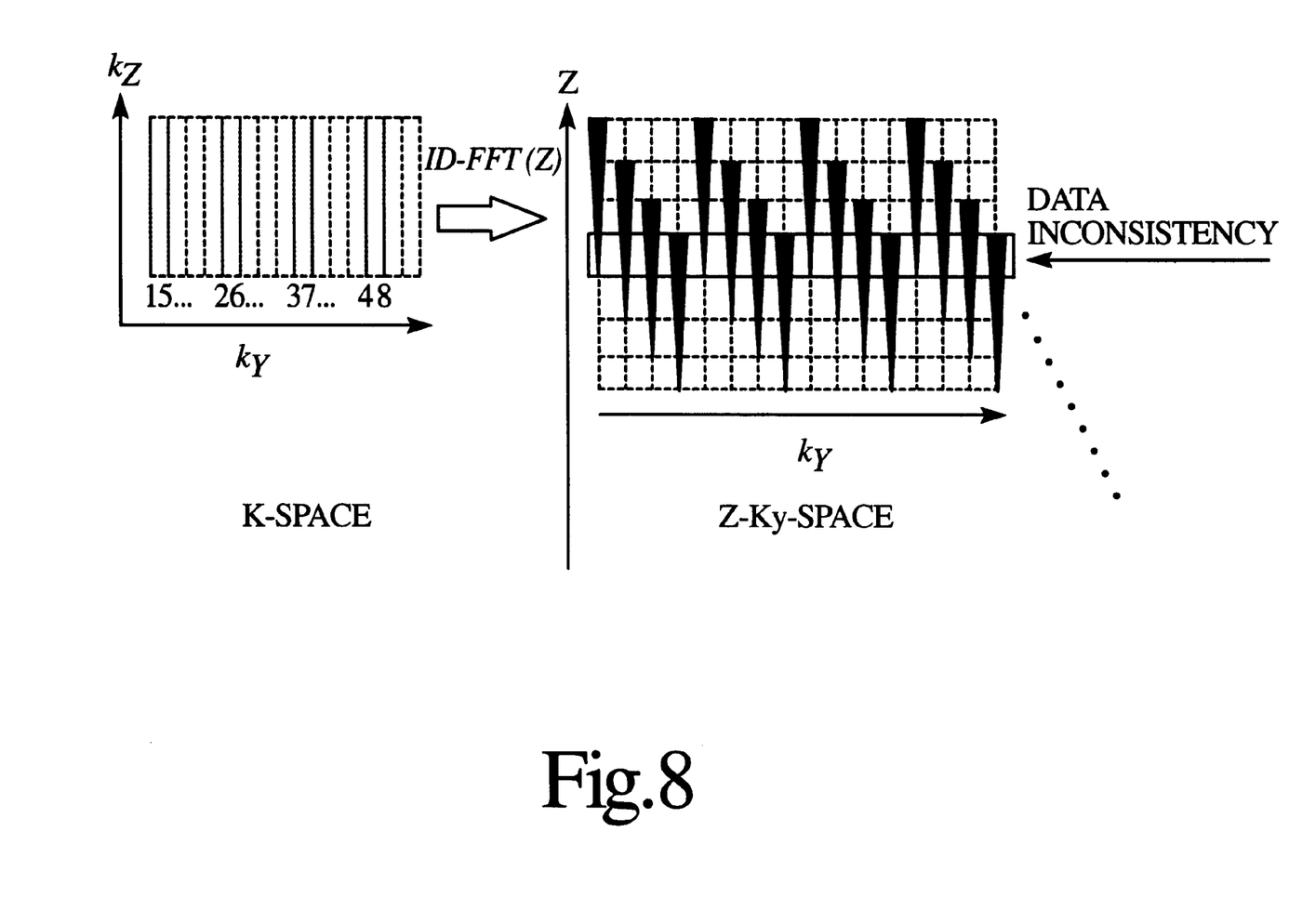
FIG. 8 is a diagrammatic illustration of data sorting and data inconsistency in SLINKY where the vertical triangles symbolize data error (phase or amplitude) across a slab which leads to data inconsistency in SLINKY, and the indices along $k_y$ indicate the acquisition order (time order)

After the correction the biased phase errors on each echo signal is removed:

$$\phi_i{}^j =_2{}^j \Lambda = \phi_{ETL}{}^j = \epsilon(j) = 0$$

as illustrated in FIGS. 7a and 7b. This correction is desirable since all of biased phase can be removed, independent on the slice position across the slab:

To perform data sorting in order to assemble full $k_Y$ lines per slice, a Z-FFT is preferably performed first (the X-FFT does not influence the data sorting by using this technique). Since raw data is usually stored as a regular 3D matrix in buffer during acquisition while slabs or volumes are sliding and $k_Y$ lines are collected in an interleaved fashion, therefore data must be resorted in z-$k_Y$ space prior to Y-FFT. This means that $k_Y$ lines which belong to designated interleaf must be forced to "walk" corresponding number of buffers in a memory, and also inserted to correct $k_Y$ position as illustrated in FIG. 8. Such data sorting involves intermatrices operation, depending on buffered data format. But since in computer technology resorting is purely a data shifting operation in a buffer, it does not decrease the reconstruction efficiency.

With regard to ghosting levels in reconstructed images, theoretically, if signal intensity oscillations (slab profile) are transformed to a periodic function of amplitude modulation along the $k_Y$ encoding direction, in the corresponding reconstructed images, ghosting artifact are generated along the phase encoding direction which is essentially the convolution of a PSF (Point Spread Function) with the original image. The ghost intensity of PSF pattern is strongly dependent on: i) the shape of the slab profile; and ii) signal oscillation.

In 3D MRA, such ghosting is easily "masked" by MIP process since the ghost intensity usually falls in the range of background signal intensity. In 3D FSE, however, there is no MIP process and the ghosting interferes with the original image. Therefore, ghosting artifacts are primarily suppressed or controlled under a tolerable level. Fortunately, in 3D FSE, the signal intensity oscillation is usually in the range of 20–30% for odd number of multi-volume acquisition (FIG. 3), and the slab profile is more symmetrical and predictable. It is anticipated that the ghosting intensity will be less than 4.3% of the primary image.

With regard to the arbitrary slab position shifting step, slab shifting is realized by changing the center frequency of RF pulse and optionally additional phase offset due 3D imaging. In the case of 3D imaging, the linear phase introduced by frequency shifting is corrected in order to avoid the violation of phase encoding relationship along $k_z$-axis (aliasing). The calculation of the parameters is given by:

$$\Delta d = m \cdot THK \text{ with } m = 0, \pm 1, \pm 2, K$$

$$\Delta f = \gamma G_S \cdot \Delta d$$

$$\Delta \phi = -2\pi \frac{\Delta d}{N_{Ztotal} \times THK}$$

where m is a user-defined parameter, THK is the slice thickness, $G_S$ is the slice selection gradient, and $T_{RF}$ is the time duration from the center of RF pulse to the end of RF pulse. The $\Delta \phi$ can be corrected in the reconstruction step instead of directly applying the phase during excitation. The $\Delta f$ and $\Delta \phi$ must be applied to all RF pulses, excitation and refocus.

Figure 9:
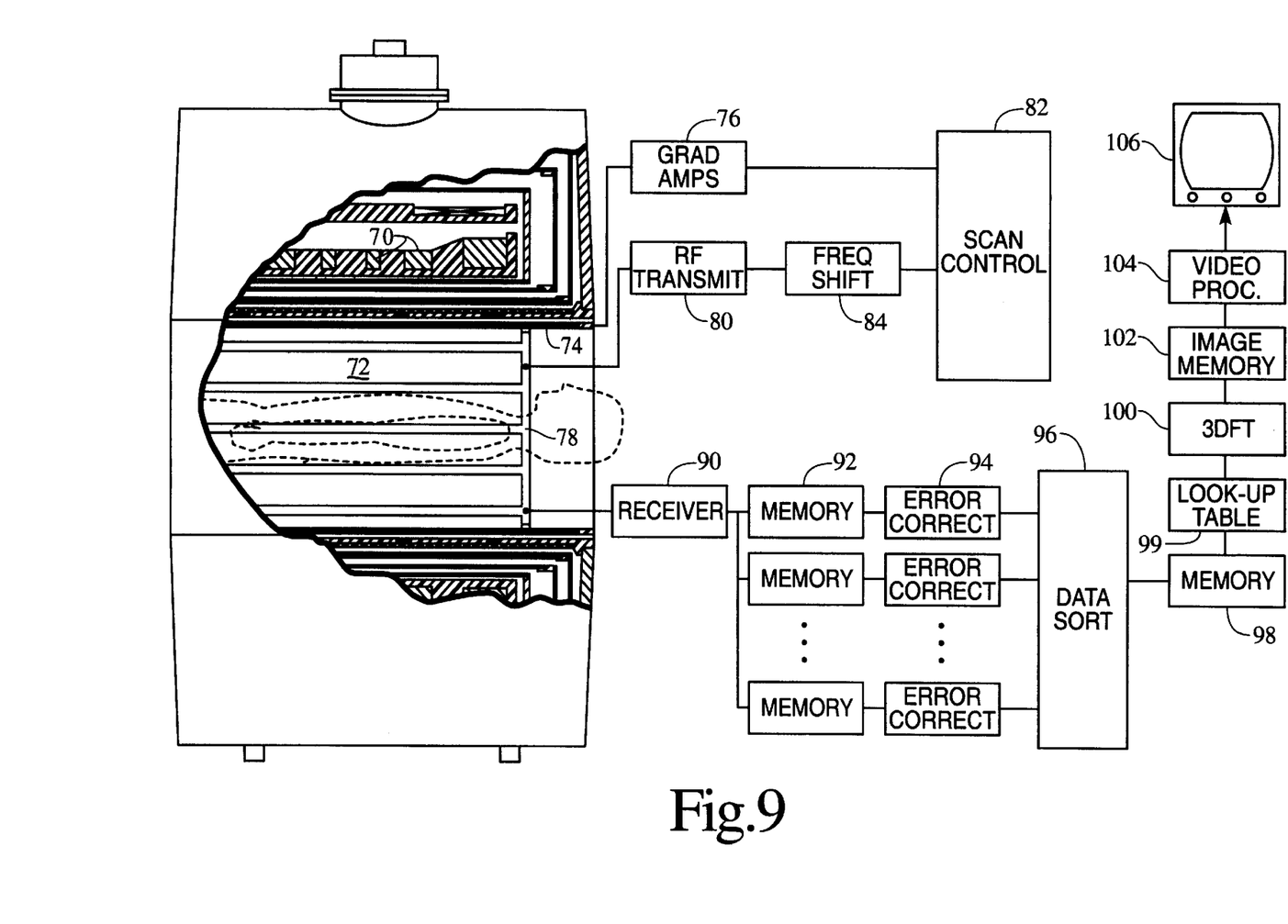
FIG. 9 is a block diagram for a magnetic resonance apparatus which carries out the imaging method of the present invention.

With reference to FIG. 9, a magnetic resonance imaging system includes the main magnet 70, preferably a cryogenic magnet, for generating a temporally constant main magnetic field through an examination region 72. A series of gradient coils 74 in conjunction with gradient amplifiers 76 generate gradient magnetic fields across the examination region. Gradient amplifiers typically generate current pules which result in corresponding gradient magnetic field pulses along the x-, y-, and z-axis for slab selection, phase encoding, and read out or frequency encoding. Radio frequency coils 78 and a radio frequency transmitter 80 generate RF excitation pulses for exciting magnetic resonance and inversion or other pulses from manipulating the magnetic resonance. A sequence control processor 82 generates appropriate RF and gradient pulse sequences, such as illustrated in conjunction with FIGS. 1–3. A frequency shift circuit 84 selectively shifts the centers frequency of the radio frequency pulses for incrementing the position of the slabs in the z-direction.

A receiver 90 receives and demodulates the magnetic resonance signals from each slab to generate a corresponding series of data lines which are stored in one of a series of memories 92. In the embodiment illustrated in FIG. 1 there are four volume memories, one for each of the four noted volumes. A phase correction processor 94 corrects phase errors in each of the volumes and at the interface between volumes in accordance with FIGS. 7a and 7b. A data sorter 96 sorts a phase corrected volume data in accordance with FIG. 9 and stores it in an accumulated memory 98 which corresponds to diagrammatic element 60 of FIG. 2. A data correction look up table 99 corrects the data in accordance with a series of phantom calibration images.

A reconstruction processor 100 implements a three dimensional fourier transform reconstruction algorithm to reconstruct the data lines into a volumetric image representation which is stored in image memory 102. A video processor 104 under operator control selects one or more slices, projection images, surface renderings, or the like from data in the image memory and converts it into appropriate format for display on a video monitor 106.

With regard to the test process, a specific phantom is used in order to examine if the data sorting and correction is correct or whether there is aliasing. A uniform phantom is then used to evaluate the suppression of venetian blind artifacts. The spatial resolution phantom is used to investigate the PSF effect, blurring, ghost level, etc. A flow phantom is used to examine the image quality, i.e. consistent CNR, under simulated CSF condition (slow, pulsatile flow).

In FSE acquisitions, multiple spin echo signals are used to encode several phase encoding lines (views) in k-space, referred to as an FSE view shot. With the imaging technique of the present invention, multiple thin slabs or volumes are slid in the slab direction by one slice thickness at every one (or several) FSE view shot. How many FSE view shots before a multi-slab sliding occurs, is controlled by parameters. This interleaving factor directly affects the effectiveness and efficiency of the technique as well as the arrangement/design of the FSE phase encoding view map in k-space.

The invention has been described with reference to the preferred embodiment(s). Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment(s), the invention is now claimed to be:

1. A method of magnetic imaging comprising:
   a) applying a first resonance excitation pulse to excite magnetic resonance in a first slab;
   b) manipulating the excited magnetic resonance to generate a series of echos which are phase encoded in accordance with a first fraction of phase encoding steps in k-space;
   c) exciting magnetic resonance in a second slab displaced from the first slab;
   d) manipulating the excited magnetic resonance in the second slab to generate a series of data lines which are phase encoded with a second fraction of phase encode gradient steps of a complete data set;
   e) exciting magnetic resonance in a third slab which partially overlaps the first slab;
   f) manipulating the excited magnetic resonance in the third slab to generate a series of data lines which are phase encoded with a third fraction of the data lines of a complete data set, the third fraction being different from the first fraction;
   g) inducing magnetic resonance in a fourth slab which is only partially overlapping the second slab;
   h) manipulating the magnetic resonance induced in the fourth slab to generate a plurality of data lines which correspond to a fourth fraction of a complete data set, the fourth fraction being different from the second fraction; and
   i) combining the data lines and reconstructing the combined data lines into an image representation.

2. The method as set forth in claim 1 further including:
   j) between steps d) and e), repeating steps c) and d) for a plurality of additional slabs displaced from the first and second slabs; and
   k) after step h), repeating steps g) and h) for a plurality of slabs which partially overlap at least the slabs generated in step j).

3. The method as set forth in claim 1 wherein:
   the third and fourth slabs overlap M−1/M of the first and second slaps, respectively; and
   steps e) and f), and g) and h) are repeated M−1 times, each time with the excited slab overlapping the respective one of the first and second slabs by 1/Nth less than a previous repetition.

4. The method as set forth in claim 3 wherein M equals 4.

5. The method as set forth in claim 1 further including:
   performing a phase correction to the set of data lines from each slab prior to step i).

6. The method as set forth in claim 1 further including:
   performing an amplitude correction to the set of data lines from each slab prior to step i).

7. The method as set forth in claim 1 further including:
   after step i), correcting the combined data in accordance with a pre-programmed look-up table.

8. A magnetic resonance imaging system having means for generating a magnetic field in an examination region, a radio frequency pulse controller and transmitter for inducing dipoles in the examination region to resonance such that radio frequency resonance signals are generated, gradient magnetic field coils and a gradient magnetic field controller for generating at least phase and read magnetic field gradient pulses in orthogonal directions across the examination region, a receiver for receiving and demodulating the radio frequency magnetic resonance signals, and an image processor for reconstructing image representations, the image processor including:
   means for applying a first resonance excitation pulse to excite magnetic resonance in a first slab;
   means for manipulating the excited magnetic resonance to generate a series of echos which are phase encoded in accordance with a first fraction of phase encoding steps in k-space;
   means for exciting magnetic resonance in a second slab displaced from the first slab;
   means for manipulating the excited magnetic resonance in the second slab to generate a series of data lines which are phase encoded with a second fraction of phase encode gradient steps of a complete data set;
   means for exciting magnetic resonance in a third slab which partially overlaps the first slab;
   means for manipulating the excited magnetic resonance in the third slab to generate a series of data lines which are phase encoded with a third fraction of the data lines of a complete data set, the third fraction being different from the first fraction;
   means for inducing magnetic resonance in a fourth slab which is only partially overlapping the second slab;
   means for manipulating the magnetic resonance induced in the fourth slab to generate a plurality of data lines which correspond to a fourth fraction of a complete data set, the fourth fraction being different from the second fraction; and
   means for combining the data lines and reconstructing the combined data lines into an image representation.

9. The apparatus of claim 8, further including:
   means for exciting magnetic resonance and manipulating the excited magnetic resonance for a plurality of additional slabs displaced from the first and second slabs; and
   means for exciting magnetic resonance and manipulating the excited magnetic resonance for a plurality of slabs which partially overlap at least the plurality of additional slabs displaced from the first and second slabs.

10. The apparatus of claim 8, wherein the third and fourth slabs overlap M−1/M of the first and second slaps, respectively.

11. The apparatus of claim 10, wherein M equals 4.

12. The apparatus of claim 8 further including means for performing a phase correction to the set of data lines from each slab prior to resconstructing an image representation.

13. The apparatus of claim 8, further including means for correcting the combined data in accordance with a pre-programmed look-up table, the combined data being corrected with the look-up table prior to being reconstructed into the image representation.

* * * * *